US012592369B2

(12) United States Patent     (10) Patent No.:   US 12,592,369 B2

Kitajima et al.     (45) Date of Patent:   *Mar. 31, 2026

---

(54) INTEGRATED METHOD AND TOOL FOR HIGH QUALITY SELECTIVE SILICON NITRIDE DEPOSITION

(71) Applicant: Applied Materials, Inc., Santa Clara, CA (US)

(72) Inventors: Tomohiko Kitajima, San Jose, CA (US); Ning Li, San Jose, CA (US); Chang Seok Kang, Santa Clara, CA (US); Naomi Yoshida, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 332 days.

This patent is subject to a terminal disclaimer.

(21) Appl. No.: 18/127,213

(22) Filed: Mar. 28, 2023

(65) Prior Publication Data

US 2023/0369031 A1    Nov. 16, 2023

Related U.S. Application Data

(60) Provisional application No. 63/341,242, filed on May 12, 2022.

(51) Int. Cl.
*H01L 21/02*    (2006.01)
*C23C 16/02*    (2006.01)
(Continued)

(52) U.S. Cl.
CPC .... *H01J 37/32899* (2013.01); *C23C 16/0227* (2013.01); *C23C 16/342* (2013.01); (Continued)

(58) Field of Classification Search
None
See application file for complete search history.

(56) References Cited

U.S. PATENT DOCUMENTS

| | | | |
|---|---|---|---|
| 6,174,813 | B1 | 1/2001 | Wang |
| 10,777,411 | B1 | 9/2020 | Nguyen et al. |

(Continued)

FOREIGN PATENT DOCUMENTS

| | | |
|---|---|---|
| CN | 113471139 A | 10/2021 |
| JP | 2009246342 A | 10/2009 |

(Continued)

OTHER PUBLICATIONS

PCT International Search Report and Written Opinion in PCT/US2023/017807 dated Jul. 24, 2023, 10 pages.

*Primary Examiner* — Asok K Sarkar

(74) *Attorney, Agent, or Firm* — SERVILLA WHITNEY LLC

(57) ABSTRACT

Methods of manufacturing memory devices are provided. The method comprises pre-cleaning a top surface of a film stack, the film stack comprising alternating layers of a first material layer and a second material layer and having one or more of a memory hole and a slit pattern opening extending through the film stack; exposing the top surface of the film stack to a growth inhibitor; selectively depositing a silicon-containing dielectric layer in a region of the film stack; and densifying the silicon-containing dielectric layer. The processing method is performed in a processing tool without breaking vacuum.

20 Claims, 7 Drawing Sheets

(51) Int. Cl.

| | |
|---|---|
| *C23C 16/34* | (2006.01) |
| *C23C 16/36* | (2006.01) |
| *C23C 16/38* | (2006.01) |
| *C23C 16/56* | (2006.01) |
| *H01J 37/32* | (2006.01) |
| *H01L 21/67* | (2006.01) |

(52) U.S. Cl.

CPC ............ *C23C 16/345* (2013.01); *C23C 16/36* (2013.01); *C23C 16/38* (2013.01); *C23C 16/56* (2013.01); *H01L 21/0217* (2013.01); *H01L 21/0234* (2013.01); *H01L 21/67167* (2013.01); *H01J 37/32816* (2013.01); *H01J 2237/20278* (2013.01); *H01J 2237/332* (2013.01); *H01J 2237/335* (2013.01); *H01J 2237/336* (2013.01)

(56) References Cited

U.S. PATENT DOCUMENTS

| | | | |
|---|---|---|---|
| 11,848,229 | B2 | 12/2023 | Mcswiney et al. |
| 2016/0172366 | A1 | 6/2016 | Koka et al. |
| 2016/0172370 | A1* | 6/2016 | Makala ................ H10D 64/691 |
| | | | 438/269 |
| 2018/0211833 | A1 | 7/2018 | Li et al. |
| 2019/0244803 | A1* | 8/2019 | Suzuki ............. H01L 21/02219 |
| 2020/0144107 | A1 | 5/2020 | Dutta et al. |
| 2020/0168453 | A1 | 5/2020 | Saly et al. |
| 2020/0266202 | A1 | 8/2020 | Kwon |
| 2021/0043448 | A1 | 2/2021 | Li et al. |
| 2021/0082814 | A1 | 3/2021 | Lee et al. |
| 2021/0082832 | A1 | 3/2021 | Yang et al. |
| 2021/0087691 | A1 | 3/2021 | Azumo et al. |
| 2021/0313228 | A1 | 10/2021 | Nguyen et al. |
| 2022/0084937 | A1 | 3/2022 | Liu et al. |
| 2023/0369031 | A1* | 11/2023 | Kitajima ............. C23C 16/0227 |

FOREIGN PATENT DOCUMENTS

| | | | |
|---|---|---|---|
| JP | 2022521842 | A | 4/2022 |
| KR | 20200127949 | A | 11/2020 |
| TW | 202213744 | A | 4/2022 |
| WO | 2010032616 | A1 | 3/2010 |
| WO | 2018098197 | A1 | 5/2018 |
| WO | 2018195423 | A1 | 10/2018 |

* cited by examiner

100

103    150    140

130    134    132    120    110    105

103    150

138    139

134    132    122    112    114    120    110    105

100

103  142          150

140

130

134
132
120
110
105

142

103

140

134
132
120
110
105

INTEGRATED METHOD AND TOOL FOR HIGH QUALITY SELECTIVE SILICON NITRIDE DEPOSITION

CROSS-REFERENCE TO RELATED APPLICATIONS

This application claims priority to U.S. Provisional Application No. 63/341,242, filed May 12, 2022, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide methods for forming 3D-NAND devices with high quality silicon-containing dielectric layers.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Current processes employed in 3D-NAND manufacturing use high temperature atomic layer deposition (ALD) or chemical vapor deposition (CVD) silicon nitride (SiN) with subsequent additional patterning steps. Selective deposition of SiN can eliminate the patterning steps. Selective deposition, however, requires relatively low deposition temperatures, which yield poor quality films.

Accordingly, there is a need in the art for 3D-NAND devices having high quality SiN films. Additionally, there is a need in the art for methods and apparatus for forming the 3D-NAND devices.

SUMMARY

One or more embodiments of the disclosure are directed to a processing method to form a logic or memory device. In one or more embodiments, a processing method to form a logic or memory device comprises: pre-cleaning a top surface of a film stack, the film stack comprising alternating layers of a first material layer and a second material layer and having one or more of a memory hole and a slit pattern opening extending through the film stack; exposing the top surface of the film stack to a growth inhibitor; selectively depositing a silicon-containing dielectric layer in a region of the film stack; and densifying the silicon-containing dielectric layer, wherein the processing method is performed in a processing tool without breaking vacuum.

Further embodiments of the disclosure are directed to processing tools. In one embodiment, a processing tool comprises: a central transfer station comprising a robot configured to move a wafer; a plurality of process stations, each process station connected to the central transfer station and providing a processing region separated from processing regions of adjacent process stations, the plurality of process stations comprising one or more of a pre-cleaning chamber, an inhibitor soaking chamber, a selective deposition chamber, and a densification chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

One or more embodiments provide a processing method in an integrated processing tool to permit selective deposition of silicon-containing dielectric films, e.g., silicon nitride, on a polysilicon sidewall or on a tunnel oxide sidewall through the high aspect ratio memory hole or through the slit pattern opening in a 3D NAND cell film stack.

Selective deposition of silicon-containing dielectric films, e.g., silicon nitride, is a low temperature process that results in poor quality films. Without intending to be bound by theory, it is thought that if the poor quality selectively deposited silicon-containing dielectric films cannot be converted to high quality silicon-containing films, selectively deposited silicon-containing films, particularly silicon nitride, cannot be used to form 3D NAND cell structures.

One or more embodiments of the disclosure are described with reference to the Figures. In the method of one or more embodiments, logic or memory devices are fabricated. In specific embodiments, 3-D NAND cell structures are fabricated. In some embodiments, the method comprises pre-cleaning a top surface of a film stack, the film stack comprising alternating layers of a first material layer and a second material layer and having one or more of a memory hole and a slit pattern opening extending through the film stack; exposing the top surface of the film stack to a growth inhibitor; selectively depositing a silicon-containing dielectric layer in a region of the film stack; and densifying the silicon-containing dielectric layer. In some embodiments, the processing method is performed in a processing tool without breaking vacuum.

Figure 1:
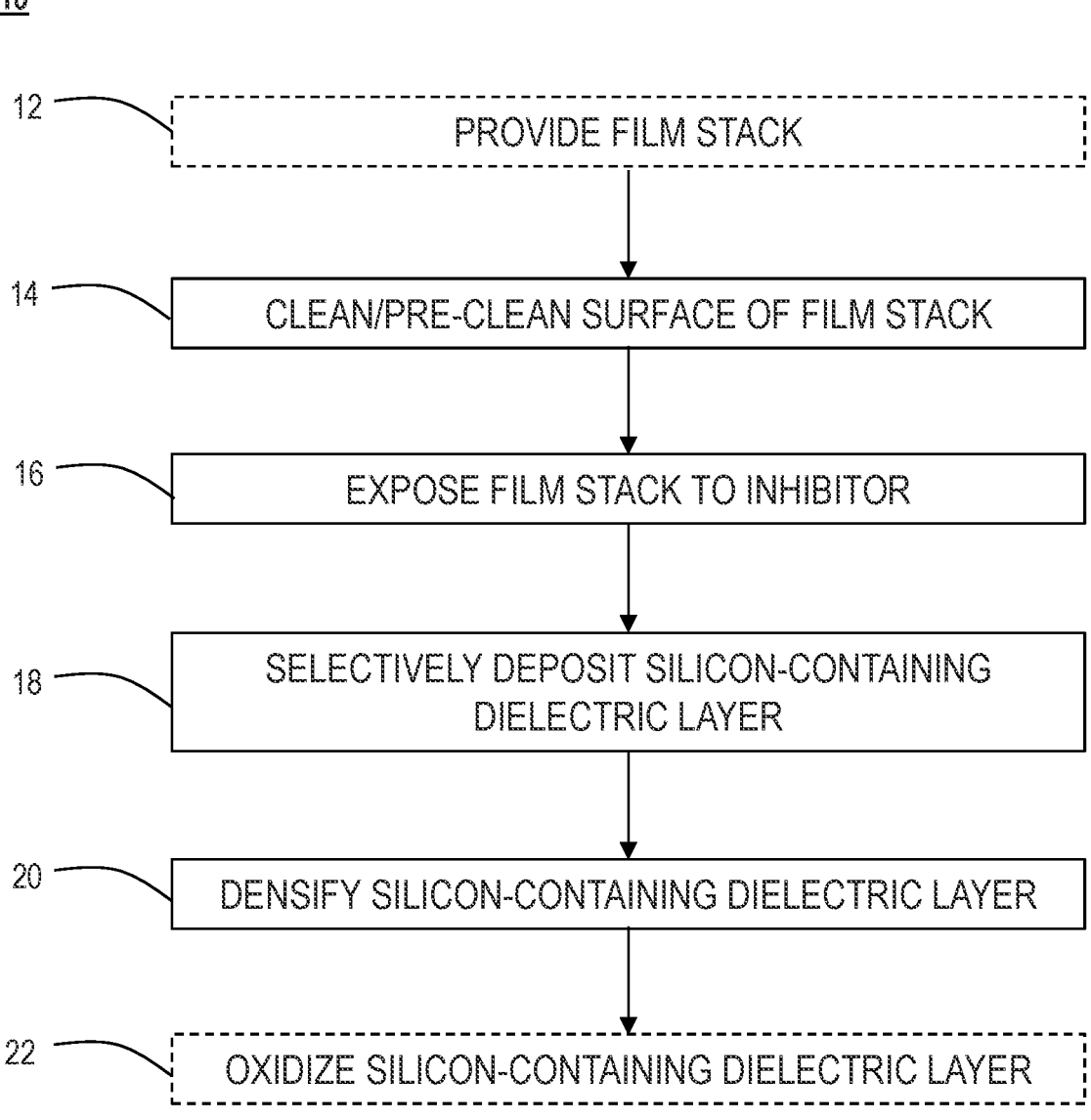
FIG. 1 depicts a process flow diagram of one embodiment of a method according to embodiments described herein.

FIG. 1 illustrates a flowchart for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 12, a film stack is provided. As used herein, the term "provided" means that the substrate is made available for processing (e.g., positioned in a processing chamber). At operation 14, the surface of the film stack is cleaned of any impurities, e.g., native oxide. At operation 16, the film stack is exposed to a growth inhibitor. At operation 18, a silicon-containing dielectric layer is selectively deposited in a region of the film stack. At operation 20, the silicon-containing dielectric layer is densified. At operation 22, the silicon-containing dielectric layer may be optionally oxidized.

Figure 2A:
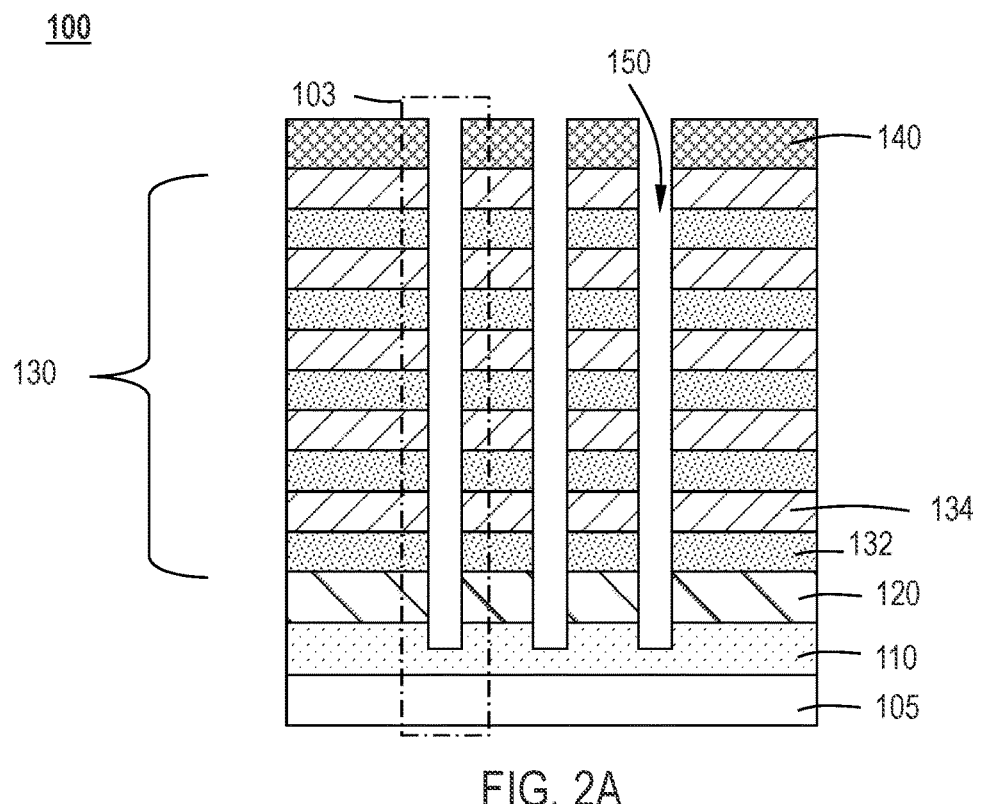
FIG. 2A illustrates a cross-sectional view of a device according to one or more embodiments.

FIGS. 2A-5 illustrate a portion of an electronic device 100 following the process flow illustrated for the method 10 in FIG. 1. FIG. 2A illustrates an electronic device 100 in accordance with one or more embodiments of the disclosure. In some embodiments, the electronic device 100 shown in FIG. 2A is formed on the substrate 105, which may be bare, in layers, as illustrated. The electronic device of FIG. 2A is made up of a substrate 105, a semiconductor layer 110, an optional sacrificial layer 120, a stack 130, and an optional oxide layer 140.

The substrate 105 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, a semiconductor layer 110 is on the substrate 105. In some embodiments, the semiconductor layer 110 may also be referred to as the common source line. The semiconductor layer 110 can be formed by any suitable technique known to the skilled artisan and can be made from any suitable material including, but not limited to, polysilicon (poly-Si). In some embodiments, the semiconductor layer 110 is a common source line that is made of a conductive or a semiconductor material.

In one or more embodiments, the optional sacrificial layer 120 is formed on the semiconductor layer 110 and can be made of any suitable material. The optional sacrificial layer 120 in some embodiments is removed and replaced in later processes. In some embodiments, the optional sacrificial layer 120 is not removed and remains within the electronic device 100. In this case, the term "sacrificial" has an expanded meaning to include permanent layers and may be referred to as the conductive layer. In one or more embodiments, the optional sacrificial layer 120 comprises a material that can be removed selectively versus the neighboring semiconductor layer 110 and second material layers 132.

In one or more embodiments, a stack 130 is formed on the optional sacrificial layer 120. The stack 130 in the illustrated embodiment comprises a plurality of alternating second material layers 132 and first material layers 134. In one or more embodiments, the first material layers 134 comprise nitride layers and the second material layers 132 comprise oxide layers. In some embodiments, the stack 130 comprises a non-replacement gate such as alternating oxide and poly-silicon, or oxide and metal, or oxide and sacrificial layer. The first material layers 134 comprise a material that is etch selective relative to the second material layers 132 so that the first material layers 134 can be removed without sub-stantially affecting the second material layers 132. In one or more embodiments, the first material layers 134 comprises one or more of polysilicon, silicon nitride (SiN), silicon carbide (SiC), silicon oxycarbide (SiOC), germanium (Ge), and titanium nitride (TiN). In one or more embodiments, the first material layers 134 comprise silicon nitride. In one or more embodiments, the second material layers 132 comprise silicon oxide.

The individual alternating layers may be formed to any suitable thickness. In some embodiments, the thickness of each second material layers 132 is approximately equal. In one or more embodiments, each second material layers 132 has a first second layer thickness. In some embodiments, the thickness of each first material layers 134 is approximately equal. As used in this regard, thicknesses which are approximately equal are within +/−5% of each other. In some embodiments, a silicon layer (not shown) is formed between the second material layers 132 and first material layers 134. The thickness of the silicon layer may be relatively thin as compared to the thickness of a layer of second material layers 132 or first material layers 134.

Figure 2B:
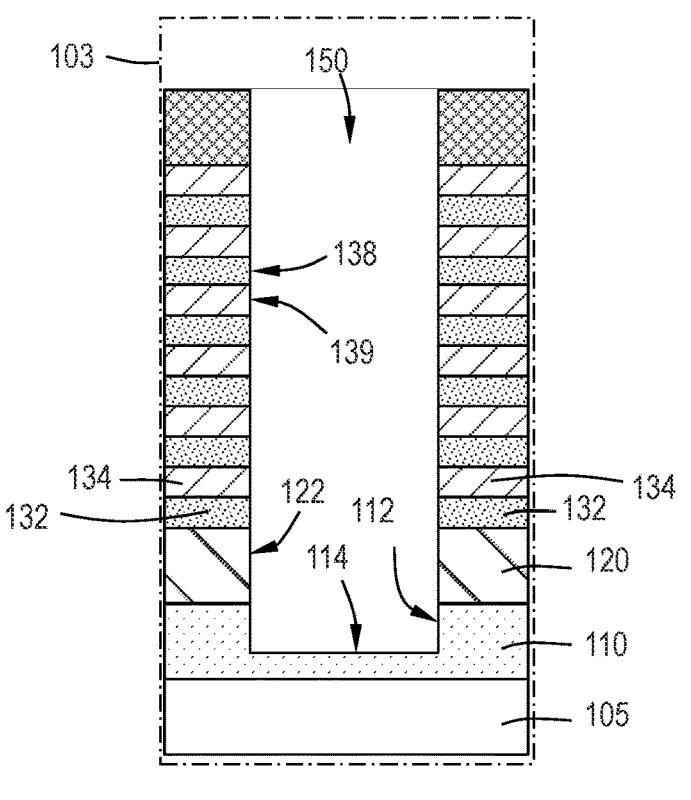
FIG. 2B illustrates an enlarged cross-sectional view of region 103 of the device of FIG. 2A according to one of more embodiments.

In one or more embodiments, a memory hole channel 150 is opened through the stack 130. In some embodiments, opening the memory hole channel 150 comprises etching through the optional oxide layer 140, stack 130, optional sacrificial layer 120, and into semiconductor layer 110. Referring to FIG. 2B, which is an expanded view of region 103, the memory hole channel 150 has sidewalls that extend through the stack 130 exposing surfaces 138 of the second material layers 132 and surface 139 of the first material layers 134.

In one or more embodiments, the memory hole channel 150 has a high aspect ratio. As used herein, the term "high aspect ratio" refers to a feature having a height:width ratio greater than or equal to about 10, 20, or 50, or more.

In one or more embodiments, the optional sacrificial layer 120 has surfaces 122 exposed as sidewalls of the memory hole channel 150. The memory hole channel 150 extends a distance into the semiconductor layer 110 so that sidewall surface 112 and bottom 114 of the memory hole channel 150 are formed within the semiconductor layer 110. The bottom 114 of the memory hole channel 150 can be formed at any point within the thickness of the semiconductor layer 110. In some embodiments, the memory hole channel 150 extends a thickness into the semiconductor layer 110 in the range of from about 10% to about 90%, or in the range of from about 20% to about 80%, or in the range of from about 30% to about 70%, or in the range of from about 40% to about 60% of the thickness of the semiconductor layer 110. In some embodiments, the memory hole channel 150 extends a distance into the semiconductor layer 110 by greater than or equal to 10%, 20%, 30%, 40%, 50%, 60%, 70%, or 80% of the thickness of the semiconductor layer 110.

Referring to FIG. 1 and FIGS. 2A and 2B, at operation 14, the exposed surface(s), e.g., surface 138 of the second material layers 132, surface 139 of the first material layers 134, and bottom 114 of the memory hole channel 150, of the film stack may be cleaned/pre-cleaned. In some embodiments, the clean/pre-clean process comprises a sublimation etch for native oxide removal. The etch process can be plasma or thermally based. The plasma processes can be any suitable plasma (e.g., conductively coupled plasma, inductively coupled plasma, microwave plasma). In one or more embodiments, the clean process may include a conventional plasma etch, or a remote plasma-assisted dry etch process. In an etch process, the device or film stack is exposed to $H_2$, $NF_3$, and/or NHs plasma species, e.g., plasma-excited hydrogen and fluorine species. For example, in some embodiments, the device or film stack may undergo simultaneous exposure to $H_2$, $NF_3$, and NHs plasma. The etch process may be performed in a preclean chamber, which may be integrated into one of a variety of multi-processing platforms. The wet etch process may include a hydrofluoric (HF) acid last process, i.e., the so-called "HF last" process, in which HF etching of the surface is performed that leaves the surface hydrogen-terminated. Alternatively, any other liquid-based pre-clean process may be employed.

Referring to FIG. 1, in one or more embodiments, at operation 16, the electronic device 100 is exposed to a growth inhibitor to avoid deposition. The growth inhibitor may be added on the second material layers 132 to prevent deposition on the second material layers. At operation 18, a silicon-containing dielectric layer 152 may be selectively deposited on the first material layers 134 and not (or substantially not) on the second material layers 132. The silicon-containing dielectric layer 152 may be deposited by any suitable means known to the skilled artisan. In one or more embodiments, the silicon-containing dielectric layer 152 is deposited, e.g., atomic layer deposition (ALD) or chemical vapor deposition (CVD), at a temperature less than 500° C.

The method 10 of one or more embodiments is an integrated method. In one or more embodiments, the method 10 may be performed in one or more processing chamber without breaking vacuum between any of the operations 12, 14, 16, 18, 20, and 22.

Figure 3A:
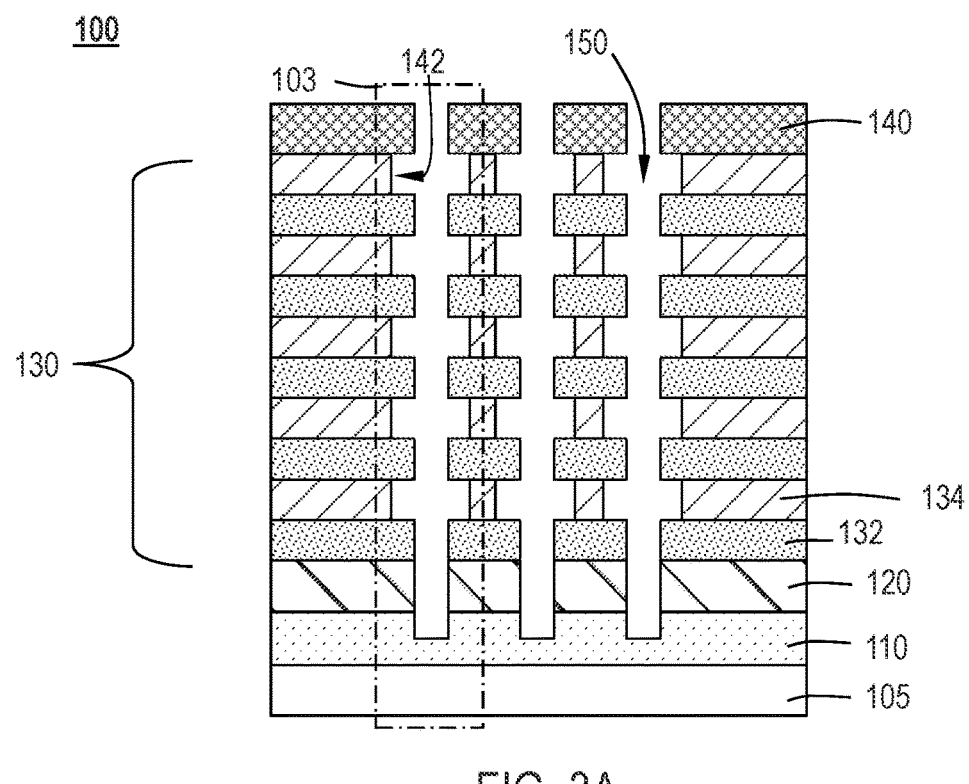
FIG. 3A illustrates a cross-sectional view of a device according to one or more embodiments.

FIGS. 3A-5 illustrate one or more embodiments where a silicon-containing layer is deposited on a recessed region 142 adjacent to the first material layers 134 through the memory hole channel 150. Specifically, FIG. 3A illustrates recessing the first material layers 134 relative to the second material layers 132 through the memory hole channel 150. In one or more embodiments, a recessed region 142 is formed. The first material layers 134 may be recessed according to any suitable process known to the skilled artisan. In other embodiments, the memory hole channel 150 can be formed structurally, for example: poly-silicon channel material can be deposited in the memory hole of SiN/SiO/SiN stack, after which SiN is removed and SiO is trimmed, leaving a SiO structure that has a recess which opens to poly-Si channel. In this case, 134 is not only recessed but completely removed, and the filled channel material is exposed.

In one or more embodiments, with reference to FIG. 1, at operation 16, a surface treatment, e.g., exposure to a growth inhibitor, is used to ensure that different terminating groups are present on the second material layers 132 so that a subsequent ALD film growth will be differentiated based on the difference surfaces. For example, to prepare a bare Si surface terminated with Si—H groups, dilute HF wet clean or a plasma-based dry clean can be used to remove native oxide on Si surface and form Si—H bonds. To prepare a passivated surface that can block ALD film growth, a hydrophobic surface monolayer can be formed on silicon oxide surface. For example, alkylamino silane can be adsorbed onto silicon oxide surface to form alkylsilyl groups on SiO surface. The ALD film growth chemistry of some embodiments is based on silicon halide and ammonia reactions which can selectively grow on bare Si surface but not a passivated SiO surface. The maximum thickness achievable by some embodiments is about 100 Å growth on bare Si, with substantially no film growth on the passivated SiO surface. Periodic SiO surface regeneration and passivation could be used to make thicker growth on bare Si than SiO.

Figure 3B:
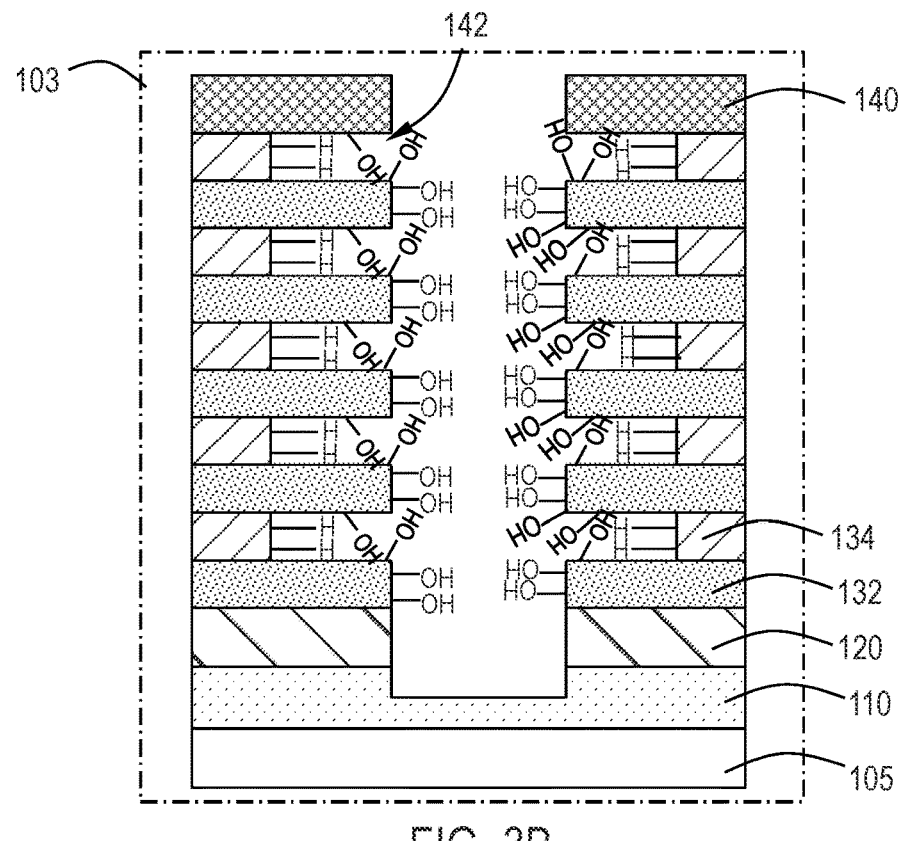
FIG. 3B illustrates an enlarged cross-sectional view of region 103 of the device of FIG. 3A according to one or more embodiments.
Figures 3C, 4A:
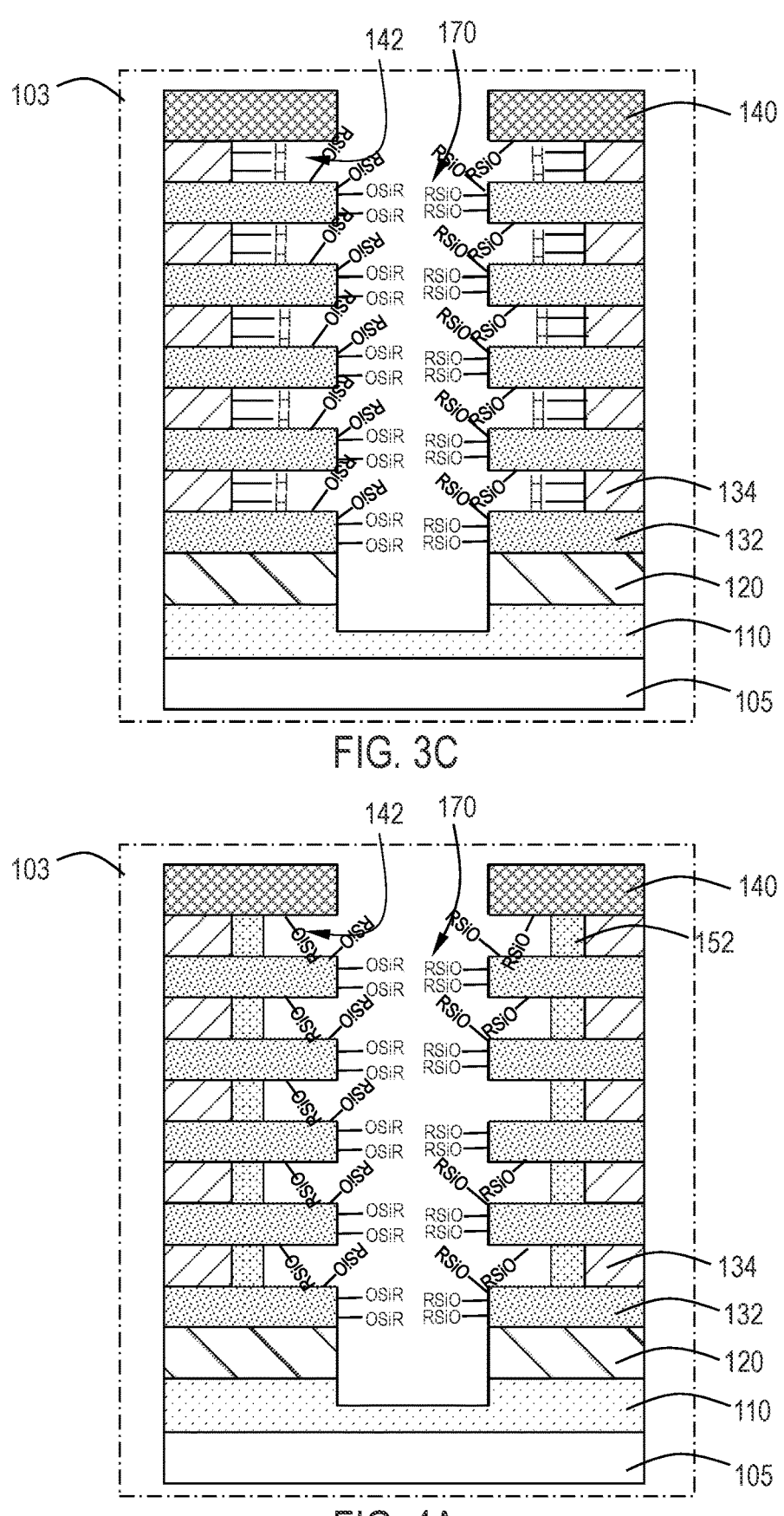
FIG. 3C illustrates an enlarged cross-sectional view of region 103 of the device of FIG. 3A according to one or more embodiments.
FIG. 4A illustrates an enlarged cross-sectional view of region 103 of the device of FIG. 3A according to one or more embodiments.

FIGS. 3B-3C show a representation of operation 16 in accordance with one or more embodiments of the disclosure. In one or more embodiments, the second material layers 132 may have a hydroxyl-terminated surface, while the first material layers 134 may have a hydrogen-terminated surface. In some unillustrated embodiments, the first material layers 134 may also have some native oxide formed thereon. While the embodiment illustrated by FIGS. 3B-3C show simple single bonds to the substrate surface, those skilled in the art will understand that this is merely for illustrative purposes and understand that the surface atom bonding is not as simple as illustrated. For example, an oxide surface can be a bridged oxygen atom bonded to more than one silicon atom and that the stoichiometry of the surface and bulk composition are not necessarily one-to-one.

The first material layers 134 and the second material layers 132 can be any suitable surfaces for selective deposition. In some embodiments, the second material layers 132 a dielectric surface with —OH ending groups and first material layers 134 comprise a silicon surface with Si—H groups with or without native oxide. In some embodiments, the second material layers 132 comprise a dielectric surface with —OH ending groups and the first material layers 134 comprise a metal surface with or without a native oxide. In some embodiments, the second material layers 132 comprise a metal oxide surface with —OH end groups and the first material layers 134 comprise a silicon surface with Si—H groups with or without native oxide. In some embodiments, second material layers 132 comprise a metal oxide surface with —OH end groups and the first material layers 134 comprise a clean metal surface without native oxide.

If a native oxide is present on the first material layers 134, removal of the native oxide may allow for a more effective selective deposition process. Exposing the substrate to an etch process can remove the native oxide from the first material layers 134. The etch process can be a wet etch process (e.g., exposure to dilute HF (1%)) or a dry etch process (e.g., exposure to a plasma). In some embodiments, the etch process is a plasma-based process. In some embodiments, the plasma-based etch process comprises exposing the substrate to a plasma of ammonia and hydrofluoric acid.

In some embodiments, removing the native oxide from the first material layers 134 provides a surface with substantially only hydrogen terminations. As used in this manner, the term "substantially only hydrogen terminations" means that the surface terminations are hydrogen for greater than or equal to about 98% of the surface area. In some embodiments, removing the native oxide from the first material layers 134 provides a surface with substantially no oxygen terminations. As used in this manner, the term "substantially no oxygen terminations" means that the surface terminations comprise less than about 2% of the surface area comprises oxygen atoms.

In one or more embodiments, the process used to remove the native oxides from the first material layers 134 also oxidizes the second material layers 132 to provide a surface with substantially no hydrogen terminations. As used in this manner, the term "substantially no hydrogen terminations" means that the surface terminations of the stated surface are hydrogen for less than or equal to about 2% of the surface area. In some embodiments, the second material layers 132 comprise substantially only hydroxyl terminations. As used in this manner, the term "substantially only hydroxyl terminations" means that the surface terminations for the subject surface are hydroxyl groups for greater than or equal to about 98% of the surface area.

The substrate, including the first material layers 134 and second material layers 132, can be exposed to a growth inhibitor to react with the hydroxyl-terminated surface to form a blocking layer 170. The growth inhibitor of some embodiments comprises an alkylsilane. In some embodiments, has a general formula $SiR_4$, where each R is independently a $C_1$-$C_6$ alkyl, a substituted or unsubstituted amine, a substituted or unsubstituted cyclic amine.

In some embodiments, the alkylsilane comprising substantially no Si—H bonds. As used in this manner, the term "substantially no Si—H bonds" means that the growth inhibitor comprises less than about 1% Si—H bonds based on the total number of silicon bonds. The growth inhibitor of some embodiments, forms surface termination —$OSiR_x$ on the second material layers 132, replacing the —OH terminations. In some embodiments, the growth inhibitor comprises one or more of 1-(trimethylsilyl) pyrrolidine or bis (dimethylamino)dimethylsilane.

In some embodiments, the alkylsilane comprises at least one substituted or unsubstituted cyclic amine with a ring having in the range of 4 to 10 atoms. In some embodiments, the alkylsilane comprises a cyclic amine that has one nitrogen atom. In some embodiments, the cyclic amine has no more than one nitrogen atom and no less than one nitrogen atom. In one or more embodiments, the cyclic amine comprises pyrrolidine in which the nitrogen atom of the pyrrolidine is bonded to the silicon atom of the alkylsilane. In some embodiments, the alkylsilane comprises 1-(trimethylsilyl) pyrrolidine. In one or more embodiments, the alkylsilane consists essentially of 1-(trimethylsilyl) pyrrolidine. As used in this manner, the term "consists essentially of" means that the alkylsilane is greater than or equal to about 98% 1-(trimethylsilyl) pyrrolidine on a molecular basis.

The substrate can be exposed to the growth inhibitor at any suitable temperature and pressure. In some embodiments, the substrate is exposed to the growth inhibitor at a temperature in the range of about 50° C. to about 500° C., or in the range of about 100° C. to about 400° C. In some embodiments, the substrate is exposed to the growth inhibitor at a pressure in the range of about 30 Torr to about 120 Torr, or in the range of about 40 Torr to about 100 Torr, or in the range of about 50 Torr to about 90 Torr. In one or more embodiments, the substrate is exposed to the growth inhibitor in a thermal process without plasma.

Figure 4B:
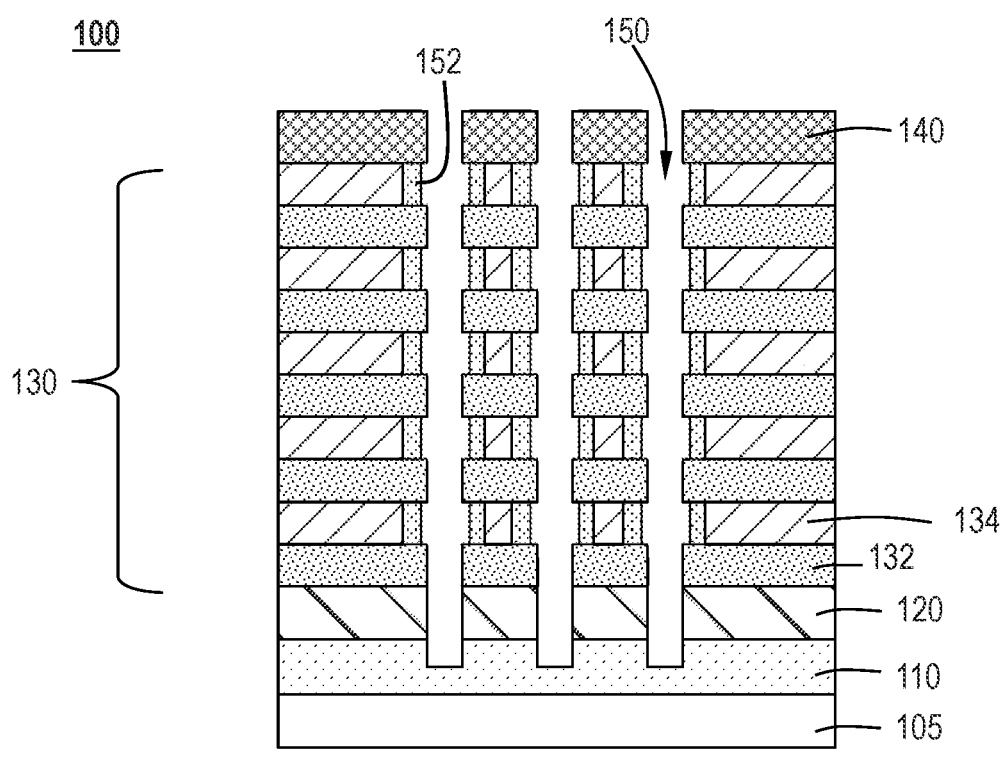
FIG. 4B illustrates a cross-sectional view of a device according to one or more embodiments.

FIGS. 4A-4B shows operation 14 in which a silicon-containing dielectric layer 152 is selectively deposited in the recessed region 142. In one or more embodiments, the silicon-containing dielectric layer 152 can be deposited by any suitable means known to the skilled artisan. In one or more embodiments, the silicon-containing dielectric layer 152 is deposition, e.g., atomic layer deposition (ALD) or chemical vapor deposition (CVD), at a temperature less than 500° C. In other embodiments, the silicon-containing dielectric layer 152 is deposited at a temperature less than 500° C., including less than 490° C., less than 450° C., less than 400° C., less than 350° C., and less than 300° C.

The silicon-containing dielectric layer 152 may comprise any suitable material dielectric material known to the skilled artisan. As used herein, the term "dielectric material" refers to a layer of material that is an electrical insulator that can be polarized in an electric field. In one or more embodiments, the silicon-containing dielectric layer 152 comprises one or more of silicon nitride (SiN), silicon carbonitride (SiCN), silicon oxynitride (SiON), silicon oxycarbonitride (SiOCN), silicon boride (SiB), and silicon boron nitride (SiBN). In specific embodiments, the silicon-containing dielectric layer 152 comprises silicon nitride (SiN).

In one or more embodiments, deposition of the silicon-containing dielectric layer 152 is selective to the first material layers 134 over the second material layers 132, such that the silicon-containing dielectric layer 152 deposits in the recessed region 142 adjacent to the first material layers 134. It one or more embodiments, the selectivity is greater than 2:1, greater than 5:1, greater than 10:1, or greater than 100:1.

In one or more embodiments, the silicon-containing dielectric layer 152 has a thickness in a range of from greater than 0 Å to 25 Å.

Without intending to be bound by theory, it is thought that the relatively low deposition temperature (i.e., less than 490° C.) leads to a poor-quality silicon-containing dielectric layer 152. Accordingly, the poor-quality silicon-containing dielectric layer 152 has a poor wet etch rate (WER) of greater than 300 Å.

As illustrated in FIGS. 4A and 4B, after forming the blocking layer 170, the substrate is exposed to one or more deposition gases to deposit a silicon-containing dielectric layer 152 on the first material layers 134 selectively over the second material layers 132. As used in this regard, the term "selectively over" means that the film is formed on the first material layers 134 to a greater extent than the film can be formed on the second material layers 132. For example, the silicon-containing dielectric layer 152 can be formed on the first material layers 134 than or equal to 20 times, 30 times, 40 times or 50 times thicker than the film is formed on the second material layers 132.

Formation of the silicon-containing dielectric layer 152 can occur by any suitable technique including, but not limited to, atomic layer deposition. In one or more embodiments, the silicon-containing dielectric layer 152 is formed in a single processing chamber. In other embodiments, the silicon-containing dielectric layer 152 is formed in a batch processing chamber, like that shown in FIG. 8. For example, the silicon-containing dielectric layer 152 may be formed by sequential exposure to a silicon precursor and a reactant. The silicon-containing dielectric layer 152 of some embodiments comprises one or more of SiN, SiO, SiON, SiC, SiCO, SiCN, or SiCON. In some embodiments, the silicon-containing dielectric layer 152 comprises silicon and one or more of oxygen, carbon, or nitrogen atoms. In some embodiments, the silicon-containing dielectric layer 152 is doped with one or more of boron (B), arsenic (As), or phosphorus (P) in an amount up to about two percent on an atomic basis.

In some embodiments, the silicon precursor comprises a silicon halide and the reactant comprises ammonia. In some embodiments, the silicon precursor comprises an organic silicon compound with or without halogen atoms. In some embodiments, the reactant comprises a nitrogen contributing species, an oxygen contributing species and/or a carbon contributing species. In some embodiments, the silicon precursor contributes one or more of nitrogen, oxygen, or carbon to the silicon-containing dielectric layer 152.

In a single processing chamber, the substrate can be exposed to the silicon precursor and reactant in the same process region of the processing chamber. In a batch processing chamber, the substrate can be exposed to the silicon precursor and reactant in alternating process regions of the processing chamber.

The substrate can be exposed to the growth inhibitor in any suitable process chamber. In some embodiments, the substrate is exposed to the growth inhibitor in the pre-clean chamber. In some embodiments, the substrate is exposed to the growth inhibitor in a separate inhibiting chamber. In some embodiments, the substrate is exposed to the growth inhibitor in the batch processing chamber. For example, the process regions of the batch processing chamber can be changed so that the reactive gas flowing in the process regions is replaced with the growth inhibitor. After forming the blocking layer 170, the flow of the growth inhibitor in the process regions can be replaced with the silicon precursor and the reactant.

The film thickness can be deposited to a predetermined amount. After some time, the silicon-containing dielectric layer 152 may begin to deposit on the second material layers 132 even though the blocking layer 170 is present. Without intending to be bound by any particular theory of operation, it is believed that the blocking layer 170 may be removed by the repeated exposures to the deposition reactants. To increase the thickness of the silicon-containing dielectric layer 152 and maintain the selectivity, the blocking layer 170 may be replenished periodically. In some embodiments, the substrate is exposed to the growth inhibitor after no more than 20, 30, 40, 50, 60, 70, 80, 90 or 100 atomic layer deposition cycles to deposit the silicon-containing dielectric layer 152. In some embodiments, the substrate is exposed to the growth inhibitor after formation of the silicon-containing dielectric layer 152 to a thickness in the range of about 30

Å to about 100 Å, or after formation of the silicon-containing dielectric layer 152 to a thickness up to about 20 Å, 30 Å, 40 Å, 50 Å, 60 Å or 70 Å.

Regeneration of the blocking layer 170 can be done by any suitable process. For example, the surface of the substrate can be purged with an inert gas (e.g., $N_2$ or He) for a time in the range of about 10 minutes to about 60 minutes at a pressure in the range of about 1 Torr to about 30 Torr. After purging the surface, the substrate can be exposed to the growth inhibitor again to regenerate the blocking layer 170. In some embodiments, the surface is purged for a time in the range of about 15 minutes to about 50 minutes, or a time in the range of about 20 minutes to about 40 minutes. In some embodiments, the surface is purged at a pressure in the range of about 10 Torr to about 25 Torr, or in the range of about 15 Torr to about 20 Torr.

In some embodiments, the blocking layer 170 is regenerated by first etching the whole surface of the substrate followed by exposure to the growth inhibitor. The etching process can be the same process used to pre-clean the surface or can be a different etching process.

The silicon-containing dielectric layer 152 can be formed at any suitable temperature. In some embodiments, the silicon-containing dielectric layer 152 is formed at a temperature in the range of about 200° C. to about 700° C., or in the range of about 300° C. to about 500° C., or in the range of about 350° C. to about 450° C. In some embodiments, the silicon-containing dielectric layer 152 is formed by a thermal process without plasma exposure. In some embodiments, the silicon-containing dielectric layer 152 is formed by a plasma enhanced process.

The silicon-containing dielectric layer 152 deposited may have film properties that can be optimized or improved by post-deposition processing. For example, a silicon nitride film deposited may have a high wet etch rate. Exposing the film to a post-deposition process can be used to improve the wet etch rate of the deposited the silicon-containing dielectric layer 152. In some embodiments, the post-deposition process improves a quality of the film. In some embodiments, the quality of the film improved comprises one or more of the wet etch rate, refractive index, density, or hydrogen concentration.

The post-deposition process of some embodiments comprises exposing the substrate surface to a decoupled plasma. The decoupled plasma of one or more embodiments comprises helium. In some embodiments, the decoupled plasma consists essentially of helium. As used in this regard, the term "consists essentially of helium" means that the plasma comprises greater than or equal to about 95 atomic percent helium. The treatment pressure of some embodiments is in the range of about 1 mTorr to about 1 Torr. Lower pressures may be used for isotropic treatment of high aspect ratio structures. Wafer temperature during treatment can range from about room temperature to about 500° C.

In some embodiments, the processing platform has an environment that does not readily oxidize the substrate surface after cleaning. As used in this regard, the term "environment" refers to the ambient conditions within at least the central transfer station. The environment of the processing platform of some embodiments also includes any processing chamber used in the deposition process. For example, if two processing chambers are used in the process, the "environment" might include the two processing chambers and the central transfer station. In some embodiments, the environment of the processing platform comprises water vapor. The water vapor can be mixed with an inert gas or neat. In some embodiments, the water vapor is present in an inert gas in an amount in the range of about 0.1% to about 90% by weight. In some embodiments, the water vapor is present in an amount in the range of about 1% to about 80%, or in the range of about 2% to about 70%, or in the range of about 3% to about 60%, or in the range of about 4% to about 50%, or in the range of about 5% to about 40%, or in the range of about 10% to about 20% by weight. In some embodiments, the environment comprises one or more of nitrogen, hydrogen, helium, argon, krypton, neon, or xenon with water vapor in an amount greater than or equal to about 0.1%, 0.5%, 1%, 2%, 3%, 4%, 5%, 6%, 7%, 8%, 9%, 10%, 12%, 14%, 16%, 18%, or 20%.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Figure 5:
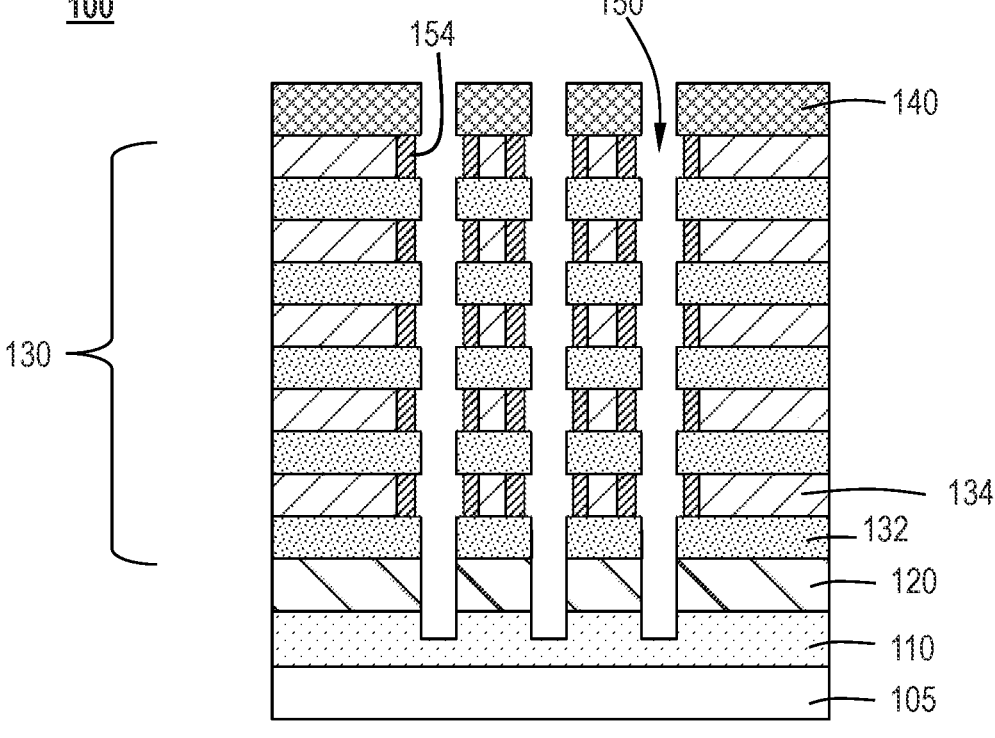
FIG. 5 illustrates a cross-sectional view of a device according to one or more embodiments.

FIG. 5 shows operation 16 and operation 18 in which the silicon-containing dielectric layer 152 is densified to form a high-quality silicon-containing dielectric film 154. The silicon-containing dielectric layer 152 may be densified by any suitable means known to the skilled artisan. In one or more embodiments, the silicon-containing dielectric layer 152 is densified by one or more of a thermal process or other treatment without adding oxygen into the silicon-containing layer. In one or more embodiments, the silicon-containing dielectric layer 152 is exposed to rapid thermal processing (RTP) to provide the high-quality silicon-containing dielectric film 154. In other embodiments, densifying the silicon-containing dielectric layer comprises exposing the silicon-containing dielectric layer 152 to a high-density plasma at a temperature less than or equal to 500° C. and at a pressure less than 1 Torr. The high-density plasma may be selected from one or more of helium (He), hydrogen ($H_2$), neon (Ne), argon (Ar), krypton (Kr), and xenon (Xe).

In one or more embodiments, at operation 18, the selectively deposited silicon-containing dielectric layer 152 is densified at a temperature greater than 800° C. to provide a silicon-containing dielectric film 154. In some embodiments, the silicon-containing dielectric layer 152 is treated at a temperature greater than 1000° C. to provide the silicon-containing dielectric film 154. In one or more embodiments, after treatment, the silicon-containing dielectric film 154 is a highly-quality film and has a wet etch rate of less than 4 Å/min, including a wet etch rate of less than 3 Å/min, less than 2 Å/min, and less than 1 Å/min.

In one or more embodiments, the silicon-containing dielectric film 154 has a thickness in a range of from greater than 0 Å to 25 Å.

The method of one or more embodiments is an integrated method. In one or more embodiments, the method may be performed in one or more processing chamber without breaking vacuum.

With reference to FIG. 1, at operation 22, in one or more embodiments, the surface of the high-quality silicon-containing dielectric film 154 is optionally oxidized.

In one or more unillustrated alternative embodiments, a silicon-containing layer may be deposited through the memory hole on the first material layer, where the first material layer has not been recessed.

Figures 6, 7:
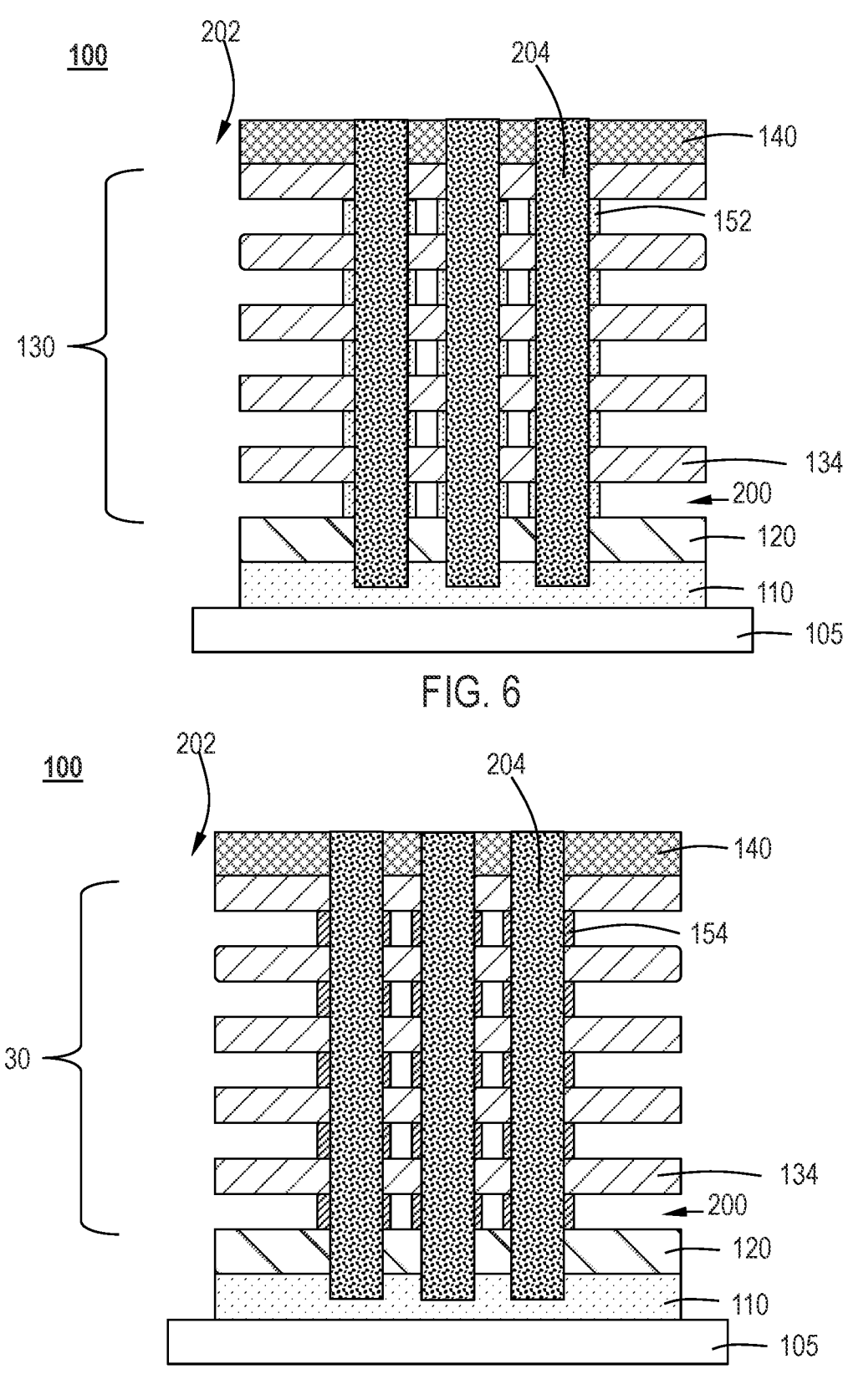
FIG. 6 illustrates a cross-sectional view of a device according to one or more alternative embodiments.
FIG. 7 illustrates a cross-sectional view of a device according to one or more alternative embodiments.

With reference to FIGS. 6-7, in one or more alternative embodiments, during processing, after the second material layers 132 in the stack 130 are removed to form an opening 200 in the mold, and a slit pattern opening 202 is formed, a silicon-containing dielectric layer 152 may be selectively deposited through the word line slit pattern opening 202 on the non-oxide containing material(s), thus depositing the silicon-containing dielectric layer 152 adjacent to the transistor layers 204 on the word line side of the device.

FIG. 7 shows an operation in which the silicon-containing dielectric layer 152 is densified to form a high-quality silicon-containing dielectric film 154. The silicon-containing dielectric layer 152 may be densified by any suitable means known to the skilled artisan. In one or more embodiments, the silicon-containing dielectric layer 152 is densified by one or more of a thermal process or other treatment without adding oxygen into the silicon-containing layer. In one or more embodiments, the silicon-containing dielectric layer 152 is exposed to rapid thermal processing (RTP) to provide the high-quality silicon-containing dielectric film 154. In other embodiments, densifying the silicon-containing dielectric layer comprises exposing the silicon-containing dielectric layer 152 to a high-density plasma at a temperature less than or equal to 500° C. and at a pressure less than 1 Torr. The high-density plasma may be selected from one or more of helium (He), hydrogen ($H_2$), neon (Ne), argon (Ar), krypton (Kr), and xenon (Xe).

In one or more embodiments, the selectively deposited silicon-containing dielectric layer 152 is densified at a temperature greater than 800° C. to provide a silicon-containing dielectric film 154. In some embodiments, the silicon-containing dielectric layer 152 is treated at a temperature greater than 1000° C. to provide the silicon-containing dielectric film 154. In one or more embodiments, after treatment, the silicon-containing dielectric film 154 is a highly-quality film and has a wet etch rate of less than 4 Å/min, including a wet etch rate of less than 3 Å/min, less than 2 Å/min, and less than 1 Å/min.

In one or more embodiments, the silicon-containing dielectric film 154 has a thickness in a range of from greater than 0 Å to 25 Å.

The method of one or more embodiments is an integrated method. In one or more embodiments, the method may be performed in one or more processing chamber without breaking vacuum.

Figure 8:
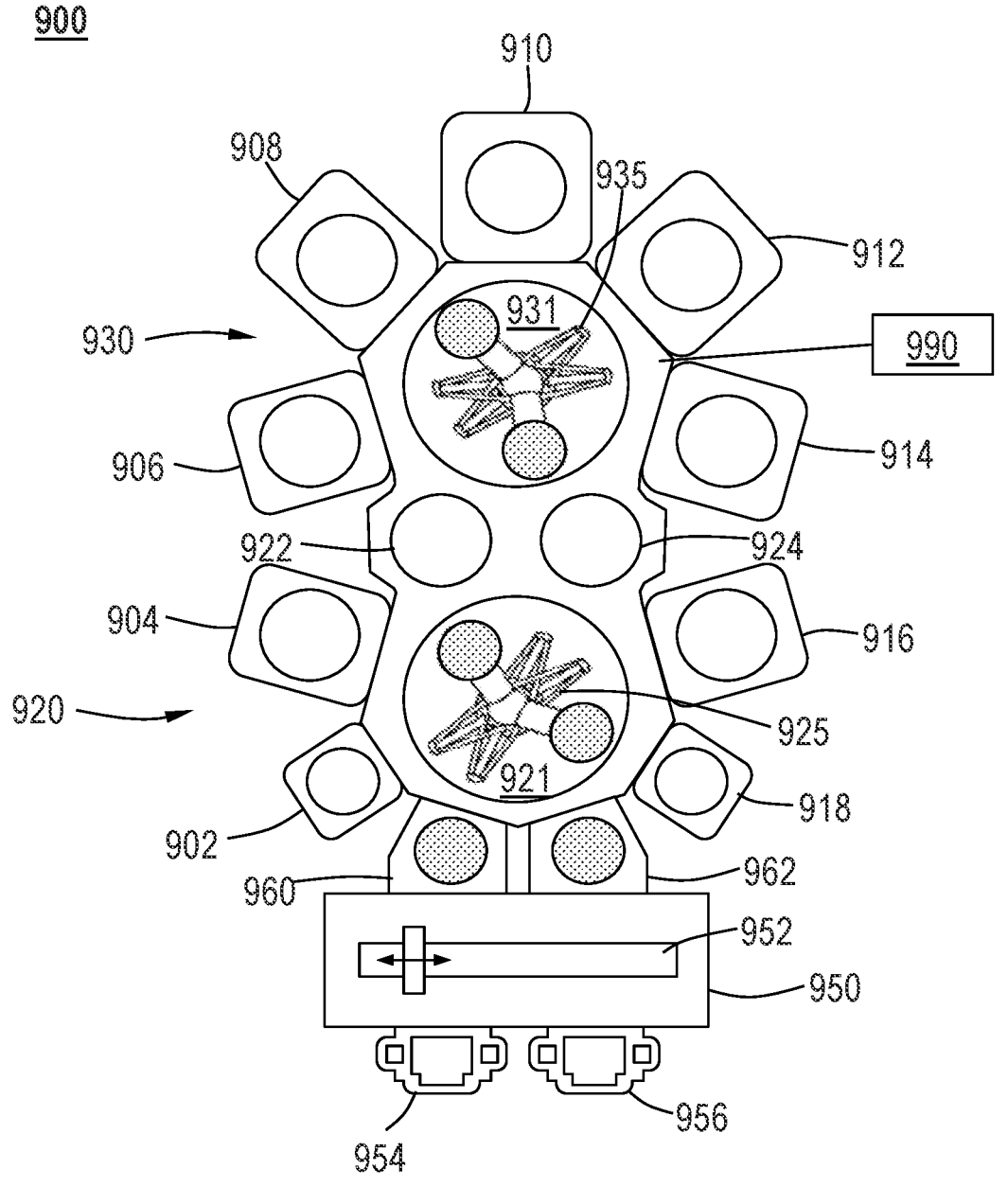
FIG. 8 illustrates a cluster tool according to one or more embodiments.

Additional embodiments of the disclosure are directed to processing tools 900 for the formation of the logic or memory devices and methods described, as shown in FIG. 8.

In one or more embodiments, the processing tool 900 is a cluster tool that includes at least one central transfer station, e.g., first transfer chamber 921, and second transfer chamber 931, with a plurality of sides. At least one robot 925, 935 is positioned within the at least one central transfer station, e.g., first transfer chamber 921, and second transfer chamber 931, and is configured to move a robot blade and a wafer to each of the plurality of sides.

In one or more embodiments, the processing tool 900 is a cluster tool that comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, an inhibitor soaking chamber, a selective deposition (ALD)

chamber, and a densification chamber (RTP). The particular arrangement of process chambers and components can be varied depending on the cluster tool and should not be taken as limiting the scope of the disclosure.

In the embodiment shown in FIG. 8, a factory interface 950 is connected to a front of the processing tool 900. The factory interface 950 includes a loading chamber 954 and an unloading chamber 956 on a front of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the processing tool 900, e.g., a cluster tool. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

In one or more embodiments, the processing tool 900 is a cluster tool that has a first section 920 and a second section 930. The first section 920 is connected to the factory interface 950 through load lock chambers 960, 962. The first section 920 includes a first transfer chamber 921 with at least one robot 925 positioned therein. The at least one robot 925 is also referred to as a robotic wafer transport mechanism. The first transfer chamber 921 is centrally located with respect to the load lock chambers 960, 962, processing chambers 902, 904, 916, 918, and buffer chambers 922, 924. The at least one robot 925 of some embodiments is a multi-arm robot capable of independently moving more than one wafer at a time. In some embodiments, the first transfer chamber 921 comprises more than one robotic wafer transfer mechanism. The at least one robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 990 has a configuration to control the selective deposition chamber to selectively deposit a silicon-containing dielectric layer in a region of a film stack, at a temperature less than 490° C. In some embodiments, the system controller 990 has a configuration to activate the plasma treatment chamber expose the silicon-containing dielectric layer to thermally treat the silicon-containing dielectric layer at a temperature greater than 800° C. to provide a silicon-containing dielectric film having a wet etch rate of less than 4 Å/min.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising one or more of a pre-cleaning chamber, an inhibitor soaking chamber, a selective deposition chamber, and a densification chamber; and a controller connected to the central transfer station and the plurality of process stations, the controller configured to activate the robot to move the wafer between process stations, and to control a process occurring in each of the process stations. In one or more embodiments, the controller causes the processing tool to perform the operations of: pre-clean a top surface of a film stack, the film stack comprising alternating layers of a first material layer and a second material layer and having one or more of a memory hole and a slit pattern opening extending through the film stack; expose the top surface of the film stack to a growth inhibitor; selectively deposit a silicon-containing dielectric layer in a region of the film stack; and densify the silicon-containing dielectric layer. In one or more embodiments, the processing tool is maintained under vacuum during each processing operation.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method to form a logic or memory device, the processing method comprising:
   pre-cleaning exposed surfaces of a memory hole or a slit pattern opening of a film stack, the film stack comprising alternating layers of a plurality of first material layers and a plurality of second material layers and having one or more of the memory hole and the slit pattern opening extending through the film stack;
   exposing the exposed surfaces of the memory hole or the slit pattern opening of the film stack to a growth inhibitor to form a blocking layer on each of the plurality of second material layers in the memory hole or the slit pattern opening of the of sex sun the memory film stack;
   selectively depositing a silicon-containing dielectric layer in a region of the film stack, the region adjacent to each of the plurality of first n the memory hole of the film stack; and
   densifying the silicon-containing dielectric layer,
   wherein the processing method is performed in a processing tool without breaking vacuum.

2. The processing method of claim 1, wherein the plurality of second material layers comprise oxide layers.

3. The processing method of claim 1, wherein the region is a recessed region formed by recessing the plurality of first material layers relative to the plurality of second material layers through the memory hole.

4. The processing method of claim 1, wherein the region is on a word line side of the film stack.

5. The processing method of claim 1, wherein the plurality of first material layers comprise one or more of polysilicon, silicon nitride, silicon carbide, silicon carbonitride, germanium, and titanium nitride.

6. The processing method of claim 1, wherein the silicon-containing dielectric layer comprises one or more of silicon nitride (SiN), silicon carbonitride (SiCN), silicon oxynitride, silicon oxycarbonitride (SiOCN), silicon boride (SiB), and silicon boron nitride (SiBN).

7. The processing method of claim 6, wherein the silicon-containing dielectric layer comprises silicon nitride.

8. The processing method of claim 1, wherein selectively depositing the silicon-containing dielectric layer comprises deposition at a temperature less than 500° C.

9. The processing method of claim 1, wherein the silicon-containing dielectric layer has a wet etch rate of less than 1 Å/min.

10. The processing method of claim 1, wherein densifying the silicon-containing dielectric layer comprises exposing the silicon-containing dielectric layer to a rapid thermal processing (RTP) process.

11. The processing method of claim 1, wherein densifying the silicon-containing dielectric layer comprises exposing the silicon-containing dielectric layer to a high-density plasma at a temperature less than or equal to 500° C. and at a pressure less than 1 Torr, the high-density plasma selected from one or more of helium (He), hydrogen ($H_2$), neon (Ne), argon (Ar), krypton (Kr), and xenon (Xe).

12. The processing method of claim 1, wherein the silicon-containing dielectric layer has a thickness in a range of from greater than 0 Å to 25 Å.

13. The processing method of claim 1, further comprising oxidizing the silicon-containing dielectric layer.

14. The processing method of claim 1, wherein the processing tool is selected from the group consisting of a single processing chamber and a batch processing chamber.

15. A processing tool comprising:
   a central transfer station comprising a robot configured to move a wafer;
   a plurality of process stations, each process station connected to the central transfer station and providing a processing region separated from processing regions of adjacent process stations, the plurality of process stations comprising one or more of a pre-cleaning chamber, an inhibitor soaking chamber, a selective deposition chamber, and a densification chamber; and
   a controller connected to the central transfer station and the plurality of process stations, the controller configured to activate the robot to move the wafer between process stations, and to control a process occurring in each of the process stations,
   wherein the controller causes the processing tool to perform operations of:
   pre-clean a film stack, the film stack comprising alternating layers of a plurality of first material layers and a plurality of second material layers and having one or more of a memory hole and a slit patten opening extending through the film stack;
   expose the film stack to a growth inhibitor to form a blocking layer on each of the plurality of second material layers in the memory hole or the slit patten opening of the film stack;
   selectively deposit a silicon-containing dielectric layer in a region of the film stack, the region adjacent to each of the plurality of first material layers in the memory hole or the slit pattern opening of the film stack; and
   densify the silicon-containing dielectric layer,
   wherein the processing tool is maintained under vacuum.

16. The processing tool of claim 15, wherein the region is on a word line side of the film stack.

17. The processing tool of claim 15, wherein the region is a recessed region formed by recessing the plurality of second material layers relative to the plurality of first material layers through the memory hole.

18. The processing tool of claim 15, wherein the plurality of first material layers comprise an oxide and the plurality of second material layers comprise one or more of polysilicon, silicon nitride, silicon carbide, silicon carbonitride, germanium, and titanium nitride.

19. The processing tool of claim 15, wherein the silicon-containing dielectric layer comprises one or more of silicon nitride (SiN), silicon carbonitride (SiCN), silicon oxynitride, silicon oxycarbonitride (SiOCN), silicon boride (SiB), and silicon boron nitride (SiBN).

20. The processing tool of claim 16, wherein selectively depositing the silicon-containing dielectric layer comprises deposition at a temperature less than 500° C.

* * * * *